In011113201B2

United States Patent
Lin

(10) Patent No.: US 11,113,201 B2
(45) Date of Patent: Sep. 7, 2021

(54) FLASH MEMORY CONTROLLER, METHOD AND ASSOCIATED ELECTRONIC DEVICE FOR MANAGING PRIORITY OF QUALITY DETECTION OR GARBAGE COLLECTION OF BLOCK

(71) Applicant: Silicon Motion, Inc., Hsinchu County (TW)

(72) Inventor: Wen-Sheng Lin, Kaohsiung (TW)

(73) Assignee: Silicon Motion, Inc., Hsinchu County (TW)

( * ) Notice: Subject to any disclaimer, the term of this patent is extended or adjusted under 35 U.S.C. 154(b) by 85 days.

(21) Appl. No.: 16/675,166

(22) Filed: Nov. 5, 2019

(65) Prior Publication Data
US 2020/0142835 A1 May 7, 2020

(30) Foreign Application Priority Data
Nov. 7, 2018 (TW) .................................. 107139505

(51) Int. Cl.
*G06F 12/0882* (2016.01)
*G06F 12/02* (2006.01)
*G06F 13/16* (2006.01)
*G11C 11/409* (2006.01)
(Continued)

(52) U.S. Cl.
CPC .......... *G06F 12/0882* (2013.01); *G06F 3/064* (2013.01); *G06F 3/0608* (2013.01); *G06F 3/0652* (2013.01); *G06F 3/0679* (2013.01); *G06F 12/0246* (2013.01);
(Continued)

(58) Field of Classification Search
CPC ...... G06F 3/0608; G06F 3/0619; G06F 3/064; G06F 3/0652; G06F 3/0679; G06F 12/0246; G06F 12/0253; G06F 12/0882; G06F 2212/1032; G06F 2212/7205; G06F 13/1668
See application file for complete search history.

(56) References Cited

U.S. PATENT DOCUMENTS 9,811,414 B2 * 11/2017 Yang .................... G06F 12/0246
9,946,483 B2 4/2018 Thangaraj
2014/0304454 A1 10/2014 Ellis
(Continued)

FOREIGN PATENT DOCUMENTS

CN 100377119 C 3/2008
CN 101241471 A 8/2008
(Continued)

*Primary Examiner* — Aracelis Ruiz
(74) *Attorney, Agent, or Firm* — Winston Hsu

(57) ABSTRACT

The present invention provides a flash memory controller, wherein the flash memory controller includes a read-only memory, a microprocessor and a decoder, wherein the read-only memory is configured to store a program code, and the microprocessor is configured to execute the program code to access a flash memory module. In the operations of the flash memory controller, when the flash memory controller is powered on, the microcontroller reads a plurality of pages of a specific block of the flash memory module, and the decoder decodes data of the plurality of pages. When any one of the pages cannot be decoded successfully, the microcontroller seals the specific block, and increase a priority of the specific block for quality detection or garbage collection.

19 Claims, 6 Drawing Sheets

(51) Int. Cl.
*G06F 3/06* (2006.01)
*G11C 11/408* (2006.01)

(52) U.S. Cl.
CPC ...... *G06F 12/0253* (2013.01); *G06F 13/1673* (2013.01); *G11C 11/409* (2013.01); *G11C 11/4085* (2013.01)

(56) References Cited

U.S. PATENT DOCUMENTS

| 2018/0074708 A1 | 3/2018 | Gerhart |
| 2018/0307496 A1 | 10/2018 | Ke |

FOREIGN PATENT DOCUMENTS

| CN | 103577342 A | 2/2014 |
| CN | 108255739 A | 7/2018 |
| CN | 108733578 A | 11/2018 |

\* cited by examiner

FLASH MEMORY CONTROLLER, METHOD AND ASSOCIATED ELECTRONIC DEVICE FOR MANAGING PRIORITY OF QUALITY DETECTION OR GARBAGE COLLECTION OF BLOCK

BACKGROUND OF THE INVENTION

1. Field of the Invention

The present invention relates to a flash memory controller.

2. Description of the Prior Art

When expected power off occurs on a flash memory controller and a flash memory module (e.g. power off recovery (POR) or sudden power off recovery (SPOR) occurs), considering the abnormal power off may affect the performance of blocks that is written, after the flash memory controller is powered on again, the data restoring operation will be performed upon the last written block before powering on, i.e. data reading and rewriting will be performed upon the flash memory module. However, with the development of the stereoscopic flash memory module, more and more pages are comprised in each block. Hence, since performing data restoring upon the last written block in each page before powering on may require a lot of time, the entire booting time of the electronic device will be prolonged. This may greatly lower the user experience.

SUMMARY OF THE INVENTION

Therefore, an objective of the present invention is to provide a flash memory controller, which can merely moves a portion of data of the last written block to another temporary block before powering on, and thereby accelerate the boot up process of the electronic device. In addition, the flash memory controller may simultaneously raise the priority of garbage collection before powering on, so as to perform garbage collection upon the last written block before powering on when the flash memory controller is not busy. The present invention may protect the content of the block being written without prolonging the booting time of the electronic device, thereby solving the problem encountered in related arts.

An embodiment of the present invention discloses a flash memory controller arranged to access a flash memory module. The flash memory module comprises a plurality of blocks, and also comprises a read-only memory (ROM), a microprocessor and a decoder. The ROM is configured to store a program code. The microprocessor is configured to execute the program code to control the access of the flash memory module. When the flash memory controller is powered on, the microprocessor reads data of a plurality of pages from a specific block in the flash memory module, and the decoder decodes data of said plurality of pages; and when any page within said plurality of pages cannot be decoded successfully, the microprocessor seals the specific block in order to raise a priority of quality detection or garbage collection of the specific block.

Another embodiment of the present invention discloses a method of managing a flash memory module, wherein the flash memory module comprises a plurality of blocks, and the method comprises: when the flash memory module is powered on, reading data of a plurality of pages from a specific block in the flash memory module; decoding data in said plurality of pages; and when any page within said plurality of pages cannot be successfully decoded, sealing the specific block and raising a priority of quality detection or garbage collection of the specific block.

Yet another embodiment of the present invention discloses an electronic device which comprises a flash memory module and a flash memory controller. The flash memory module comprises a plurality of blocks. The flash memory controller is configured to access the flash memory module. When the flash memory controller and the flash memory module are powered on, the flash memory controller reads data of a plurality of pages from a specific block in the flash memory module, and decodes data in said plurality of pages; and when any page within said plurality of pages cannot be successfully decoded, the flash memory controller seals the specific block and raises a priority of quality detection or garbage collection of the specific block.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
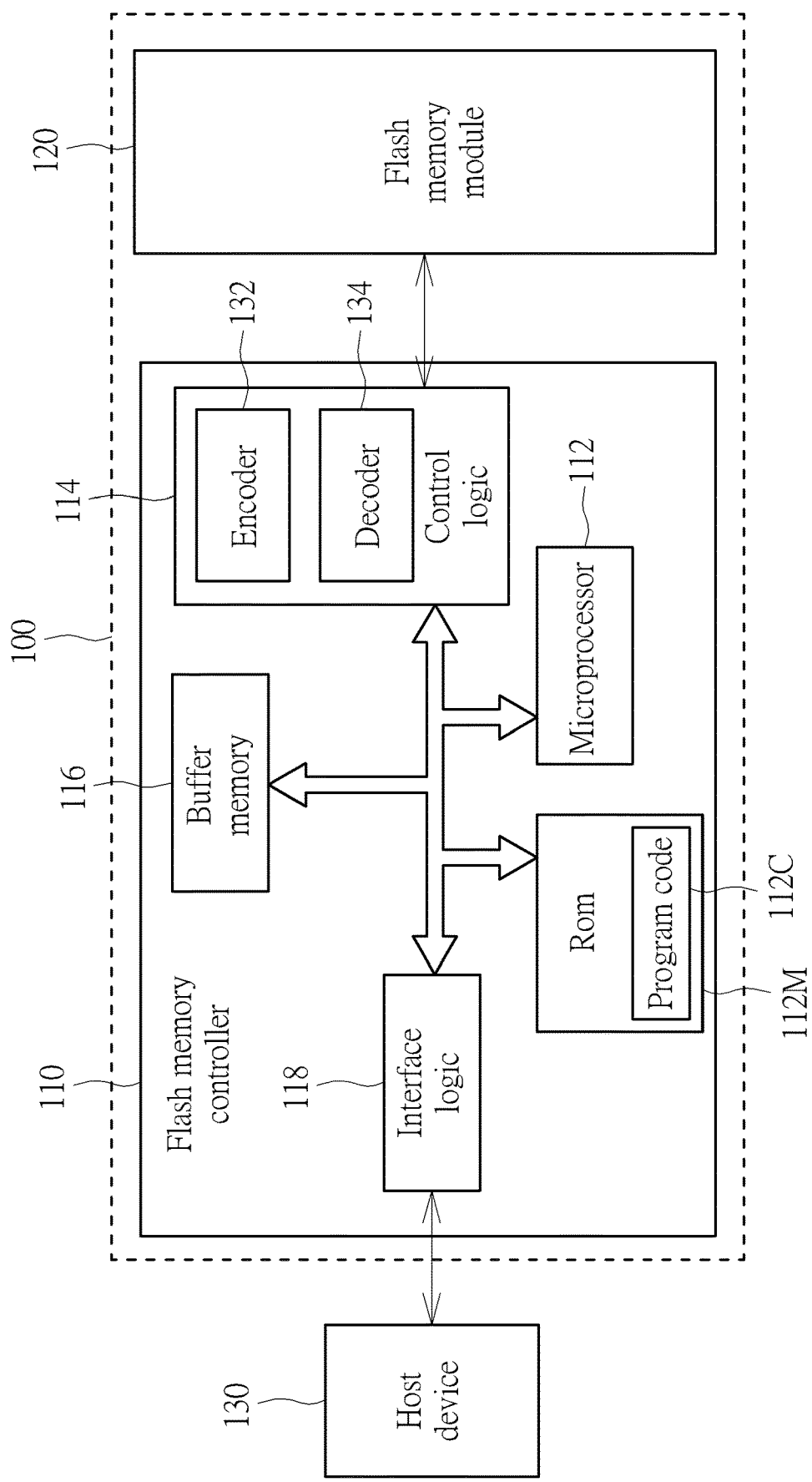
FIG. 1 is a diagram illustrating a memory device according to an embodiment of the present invention.

FIG. 1 is a diagram illustrating a memory device 100 according to an embodiment of the present invention. The memory device 100 comprises a flash memory module 120 and a flash memory controller 110, and the flash memory controller 110 is arranged to access the flash memory module 120. According to this embodiment, the flash memory controller 110 comprises a microprocessor 112, a Read Only Memory (ROM) 112M, a control logic 114, a buffer memory 116, and an interface logic 118. The ROM 112M is arranged to store a program code 112C, and the microprocessor 112 is arranged to execute the program code 112C to control the access of the flash memory module 120. The control logic 114 comprises an encoder 132 and a decoder 134, wherein the encoder 132 is arranged to encode the data written to the flash memory module 120 in order to generate a corresponding checking code (also called as Error Correction Code (ECC)), and the decoder 134 is arranged to decode the data read from the flash memory module 120.

Typically, the flash memory module 120 comprises a plurality of flash memory chips, each comprising a plurality of blocks, and the flash memory controller 110 uses "block" as the unit to erase data of the flash memory module 120. In addition, a block records a certain number of pages, wherein the flash memory controller 110 uses "page" as the unit to write data into the flash memory module 120. The flash memory module 120 is a stereoscopic (3D) NAND flash memory module.

In practice, the flash memory controller 110 which executes program code 112C via microprocessor 112 may utilize the inner elements thereof to perform various control operations, e.g. utilizing the control logic 114 to control the access operations of the flash memory module 120 (especially the access operations for at least one block or at least one page), utilizing the buffer memory 116 to perform required buffering processes, and utilizing the interface logic 118 to communicate with a host device 130. The buffer memory 116 is implemented with a Random Access Memory (RAM). For example, the buffer memory 116 may be a Static RAM (SRAM), but the present invention is not limited thereto.

In an embodiment, the memory device 100 may be a portable memory device (e.g. a memory card conforming to the SD/MMC, CF, MS or XD specification), and the host device 130 may be an electronic device connectable to a memory device, e.g. a cellphone, notebook, desktop computer, etc. In another embodiment, the memory device 100 may be a solid state drive (SSD), or an embedded storage device conforming to the Universal Flash Storage (UFS) or the Embedded Multi Media Card (EMMC) specification, and may be placed in an electronic device, such as a cellphone, notebook, desktop computer, etc. For example, the host device 130 may be a processor of the electronic device.

Figure 2:
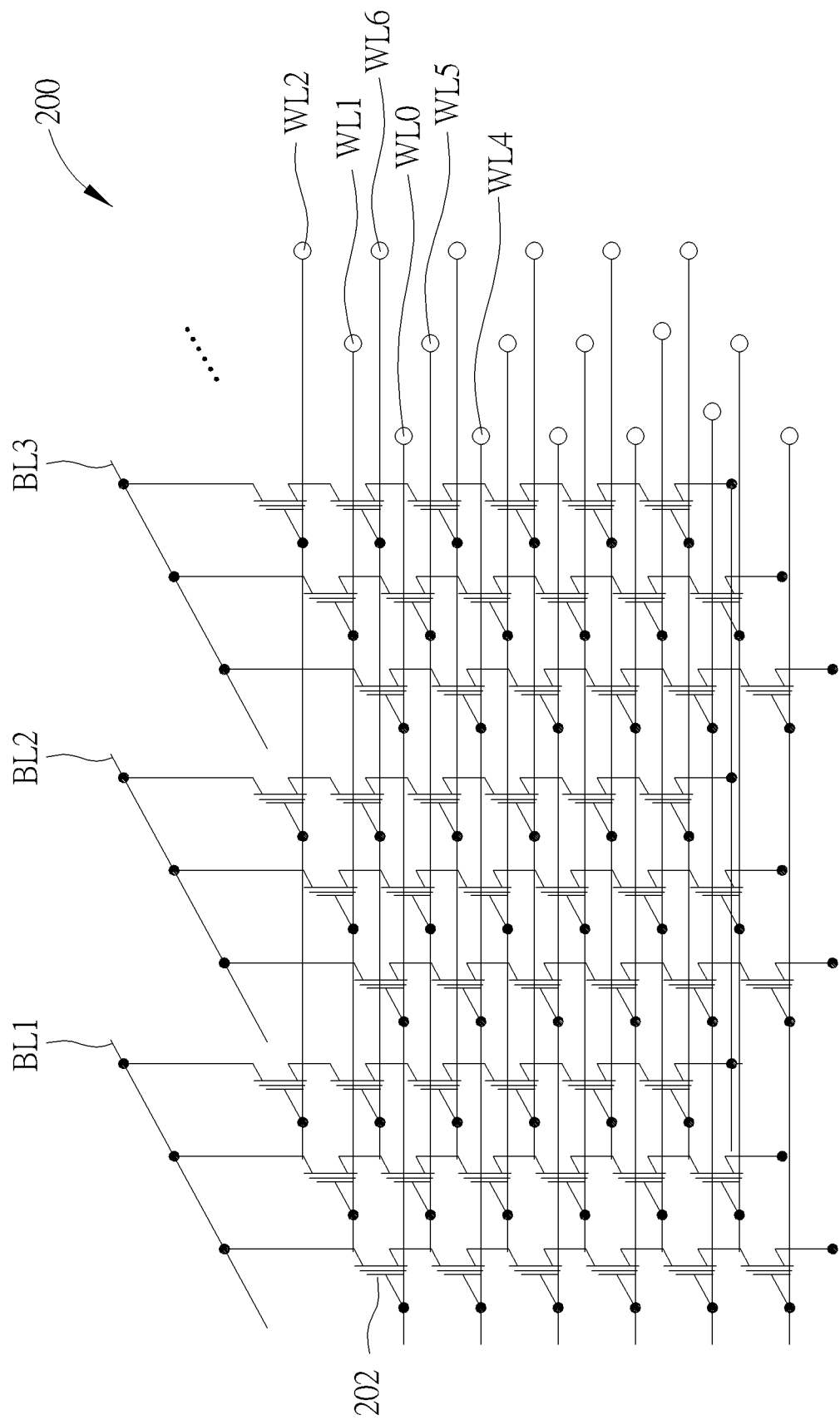
FIG. 2 is a diagram illustrating a block in a flash memory according to an embodiment of the present invention.

FIG. 2 is a diagram illustrating a block 200 in the flash memory 120 according to an embodiment of the present invention, wherein the flash memory module 120 may be a stereoscopic NAND flash memory. As shown in FIG. 2, the block 200 comprises a plurality of memory units (e.g. the floating gate transistor 202 or other charge trapping elements shown in FIG. 2), which forms the stereoscopic NAND flash memory architecture via multiple bit lines (FIG. 2 only shows bit lines BL1-BL3, but actually there can be more bit lines) and multiple word lines (FIG. 2 only shows word lines WL0-WL2 and WL4-WL6 but actually there can be more word lines). In FIG. 2, taking the topmost plane as example, all floating gate transistors on the word line WL0 form at least one page, all floating gate transistors on the word line WL1 form at least another page, and all floating gate transistors on the word line WL2 form at least another page, and so on. In addition, according to different writing methods of the flash memory, the definition between the word line WL0 and pages (such as logic pages). Specifically, when using the Single-Level Cell (SLC) to performing writing, all floating gate transistors on the word line WL0 are corresponding to a single logic page. When using the Multi-Level Cell (MLC) to perform writing, all floating gate transistors on the word line WL0 are corresponding to two logic pages. When using the Triple-Level Cell (TLC) to perform writing, all floating gate transistors on the word line WL0 are corresponding to three logic pages. On the other hand, when using the Quad-Level Cell (QLC) to perform writing, all floating gate transistors on the word line WL0 are corresponding to four logic pages. Since one skilled in the art should be readily to understand the relationship between the structure of the stereoscopic NAND flash memory and word lines, the detailed descriptions thereof are omitted here for brevity.

In the architecture shown in FIG. 2, multiple word lines are defined as belonging to the same word line group, and the word lines in the word line group may commonly share a portion of control circuit, which results in the failure of writing data to a floating gate transistor on a word line within the word line group (i.e. writing failure occurs). This may cause errors in data of floating gate transistors on other word lines of the word line group. In an embodiment, word lines positioned on the same plane will be categorized into the same word line group. Refer to FIG. 2, assuming there are four bit lines on the same plane, the word lines WL0-WL3 will be grouped into a first word line group, and the word lines WL4-WL7 will be grouped into a second word line group, and so on. Assuming the manner the flash memory controller 110 writes data to pages of the first word line group is sequentially writing data to the floating gate transistors 202 of the word lines WL0, WL1, WL2 and WL3, and when the writing to the word lines WL0, WL1 and WL2 are all successful except the writing to the word line WL3 fails (e.g. some errors have occurred), errors may also occur in some data in the word lines WL0, WL1 and WL2 that are previously written successfully. In addition, assuming the manner the flash memory controller 110 writes data to the pages of the second word line group is sequentially writing data to the floating gate transistors 202 of the word lines WL4, WL5, WL6 and WL7 and errors occur on writing to the word line WL4, the word lines WL5, WL6 and WL7 will be also considered as unstable and thus not suitable to be written.

Figure 3:
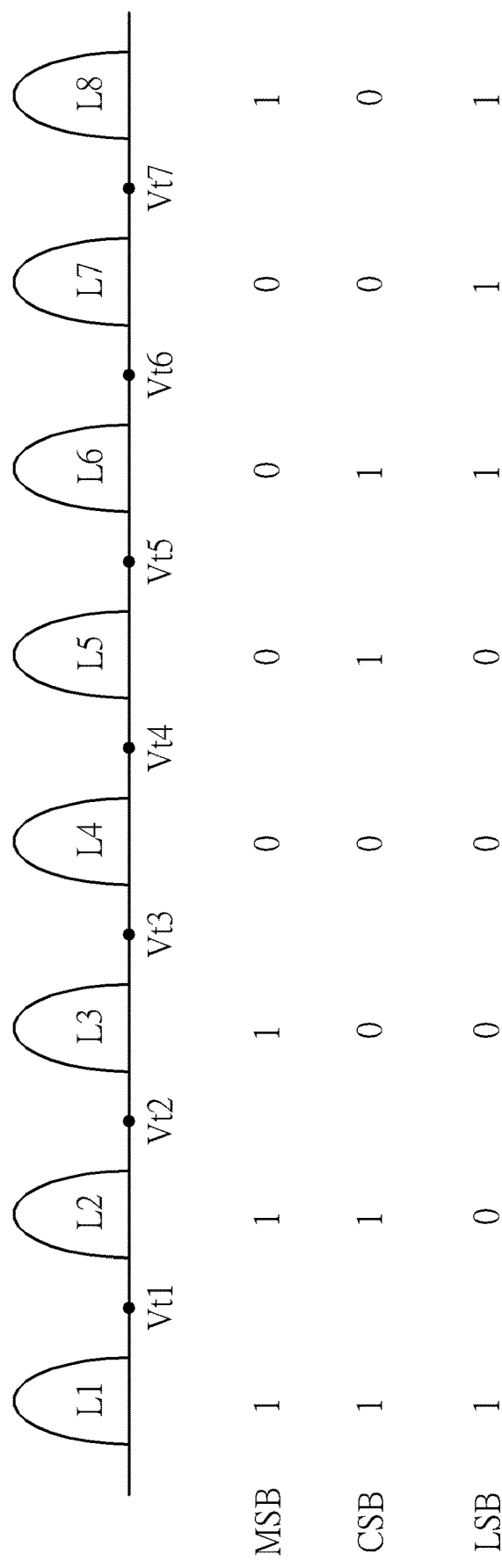
FIG. 3 is a diagram illustrating writing voltage levels and threshold voltages in a page.

FIG. 3 is a diagram illustrating the writing voltage levels L1-L8 and the threshold voltages Vt1-Vt7 when using a TLC as the block 200. As shown in FIG. 3, each floating gate transistor 202 may be programmed as having the voltage level L1 (i.e. (MSB, CSB, LSB)=(1, 1, 1)), the voltage level L2 (i.e. (MSB, CSB, LSB)=(1, 1, 0)), the voltage level L3 (i.e. (MSB, CSB, LSB)=(1, 0, 0)), the voltage level L4 (i.e. (MSB, CSB, LSB)=(0, 0, 0)), the voltage level L5 (i.e. (MSB, CSB, LSB)=(0, 1, 0)), the voltage level L6 (i.e. (MSB, CSB, LSB)=(0, 1, 1)), the voltage level L7 (i.e. (MSB, CSB, LSB)=(0, 0, 1)) or the voltage level L8 (i.e. (MSB, CSB, LSB)=(1, 0, 1)). When the flash memory controller 110 needs to read the least significant bit (LSB) within the floating gate transistor 202, the flash memory controller 110 may use the threshold voltages Vt1, Vt5 to read the floating gate transistor 202, and then generates "1" or "0" according to the conduction state of the floating gate transistor 202 (i.e. depending on whether there is current generated). Similarly, when the flash memory controller 110 needs to read the central significant bit (CSB) within the floating gate transistor 202, the flash memory controller 110 may use the threshold voltages Vt2, Vt4 and Vt6 to read the floating gate transistor 202, and then generate "1" or "0" according to the conduction state of the floating gate transistor 202 (i.e. depending on whether there is current generated), for the decoder 134 to perform decoding. Similarly, when the flash memory controller 110 needs to read the most significant bit (MSC) within the floating gate transistor 202, the flash memory controller 110 may use the threshold voltages Vt3 and Vt7 to read the floating gate transistor 202, and then determine whether the MSB is "1" or "0" according to the conduction state of the floating gate transistor 202 (i.e. depending on whether there is current generated), for the decoder 134 to perform decoding. In this embodiment, when the floating gate transistor 202 is in the voltage level L1, it can be called an erase state, and when the floating gate transistor 202 is in any of the voltage level L2-L8, it can be called a program state.

It should be noted that the example shown in FIG. 3 is merely for illustrating the process that the flash memory controller reads the floating gate transistor 202, and is not meant to be a limitation of the present invention. More specifically, the aforementioned LSB, CSB and MSB may have different encoding methods, and the flash memory controller may additionally use auxiliary voltage to read the floating gate transistor 202 in order to provide more information for the decoder 134 to perform decoding. In addition, since one skilled in the art should be readily to understand how to apply the above embodiment to the SLC, MLC and QLC versions after viewing FIG. 3 and associated contents, the detailed descriptions are omitted here for brevity.

In general, when the flash memory controller 110 and the flash memory module 120 are powered on, the last written block before powering on will be scanned in order to verify the data quality, as a reference of whether abnormal power off has occurred. If it is determined that the abnormal power off has occurred, data restoration will be performed upon the last written block. However, influenced by the abnormal power off, the quality of pages of the last written block may be deteriorated, resulting in unwanted long data restoration session which prolongs the booting time of the electronic device. To solve this problem, in this embodiment, after the flash memory controller 110 and the flash memory module 120 are powered on, data restoration will only be performed upon a portion of the pages of the last written block before powering on. After that, the last written block is sealed and the priority of quality detection and garbage collection thereof is raised, so that when the flash memory controller 110 is not busy, the flash memory controller 110 may preferentially perform quality detection or garbage collection upon the last written block in order to ensure the data correctness.

Figure 4:
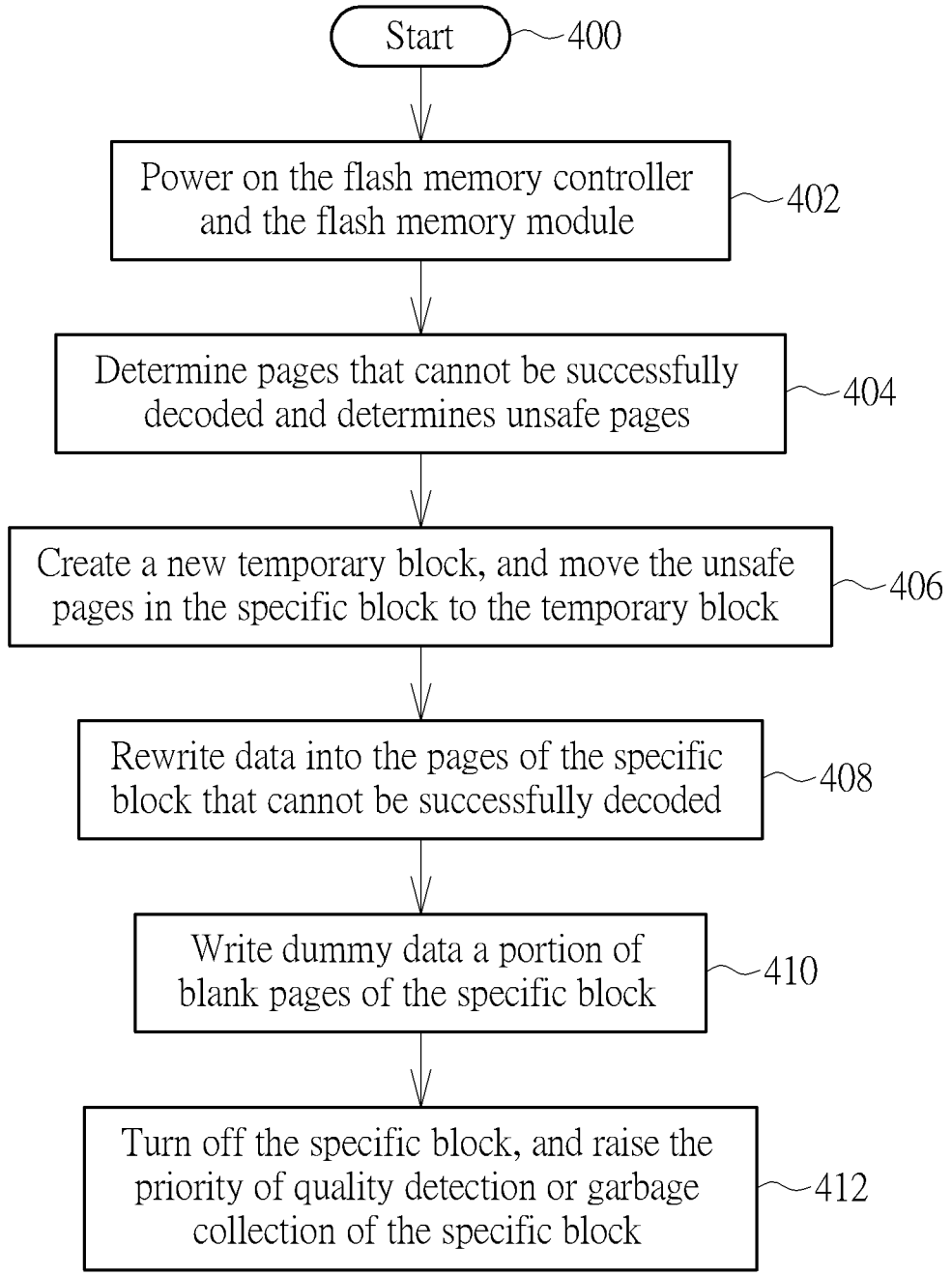
FIG. 4 is a flowchart illustrating a method of managing a flash memory module according to an embodiment of the present invention.

To be more specific please refer to FIG. 4, which is a flowchart illustrating a method of managing a flash memory module 120 according to an embodiment of the present invention. In Step 400, the flow begins. In Step 402, the flash memory controller 110 and the flash memory module 120 are powered on and perform initialization operations. Meanwhile, the flash memory controller 110 may determine whether abnormal power off has occurred before powering on. For example, when the memory device 100 is powered ON/OFF normally, the flash memory controller 110 may store the tables and data in the buffer memory 116 to the flash memory module 120 which comprises a flag for showing whether the memory device 100 has been powered off normally. Hence, after powering on, the flash memory controller 110 may determine whether the memory device 100 has encountered abnormal power off via reading the aforementioned flag stored in the flash memory module 120. For example, if the aforementioned flag is not correctly set, it can be determined that the abnormal power off has occurred. In another embodiment, the flash memory controller 110 may sequentially read all pages within the last written block (hereinafter "specific block") of the memory device before powering on, in order to determine whether data in those pages can be correctly read or not (i.e. by testing if the pages can be corrected by error correcting codes). When any page that cannot be correctly read exists, it provides that the memory device 100 has encountered abnormal power off. In another embodiment, the flash memory controller 110 may sequentially read pages of the last one written word line group (or the last two written word line groups) of the specific block before the memory device is powered on, in order to determine whether data in those pages can be correctly read or not (i.e. cannot be corrected by using error correction codes). If there is any page that cannot be correctly read, the memory device 100 will be determined as having encountered abnormal power off. In this embodiment and following descriptions, the memory device 100 is assumed to have encountered the abnormal power off.

Figure 5:
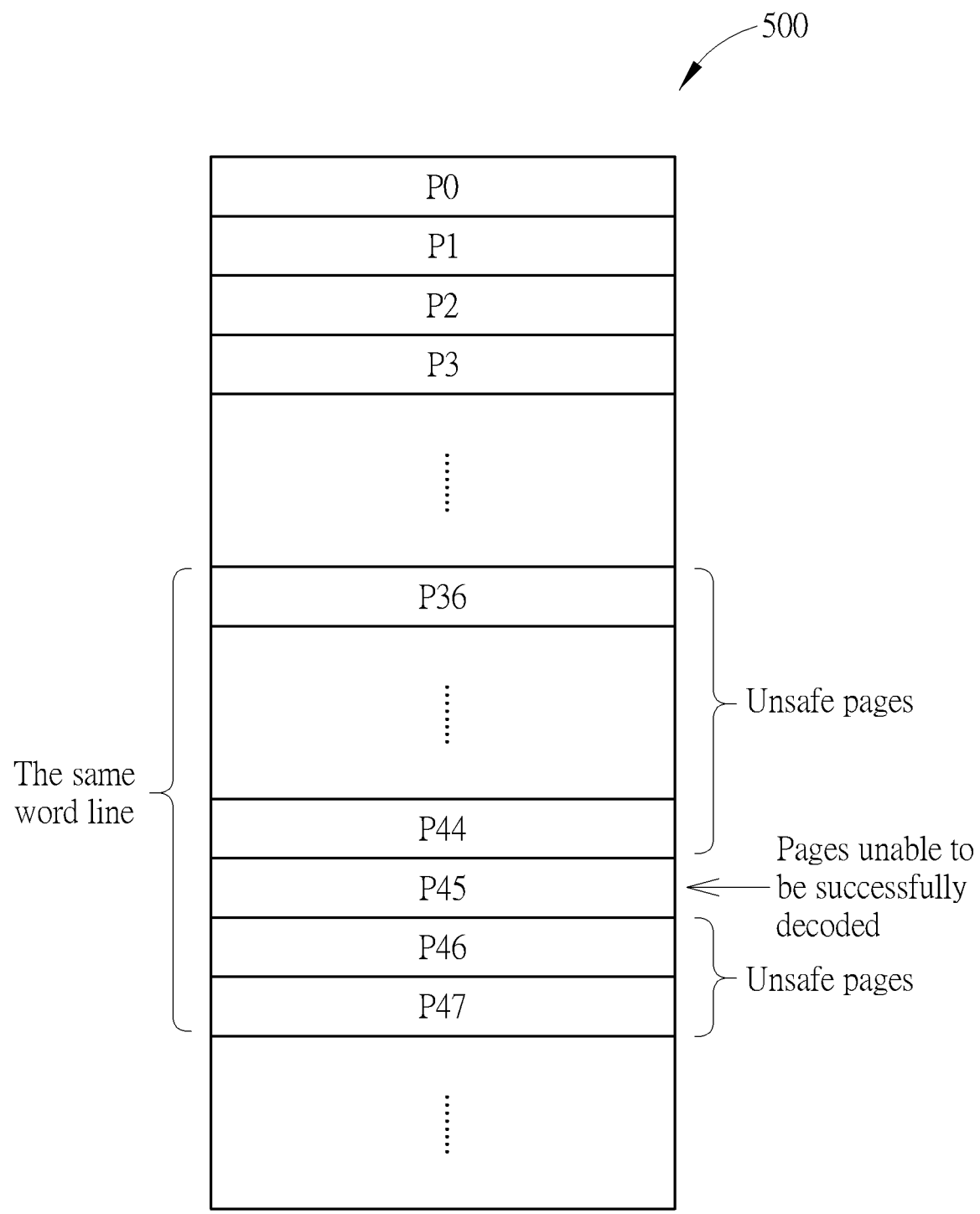
FIG. 5 is a diagram illustrating the determination of pages that cannot be successfully decoded and unsafe pages within a specific block.

In Step 404, via decoding at least one portion of pages of the specific block, the flash memory controller 110 determines at least one page that cannot be successfully decoded and determines a plurality of unsafe pages, wherein the pages that cannot be successfully decoded means that the decoder cannot completely decode all data in those pages, while unsafe pages represent the pages belonging to the same word line group (or an adjacent word line group) of the pages that cannot be successfully decoded. Please refer to FIG. 5, which shows a specific block 500. Assume that during the flash memory controller 110 reading pages in the specific block 500, only Page P45 cannot be successfully decoded, the flash memory controller 110 may determine Page P45 as a page that cannot be successfully decoded and determine other pages P36-P44 and P46-P47 in the same word line group of Page P45 as unsafe pages. In another embodiment, pages P24-P35 in a word line group adjacent to the word line group of Page P45 can be also determined as unsafe pages.

Figure 6:
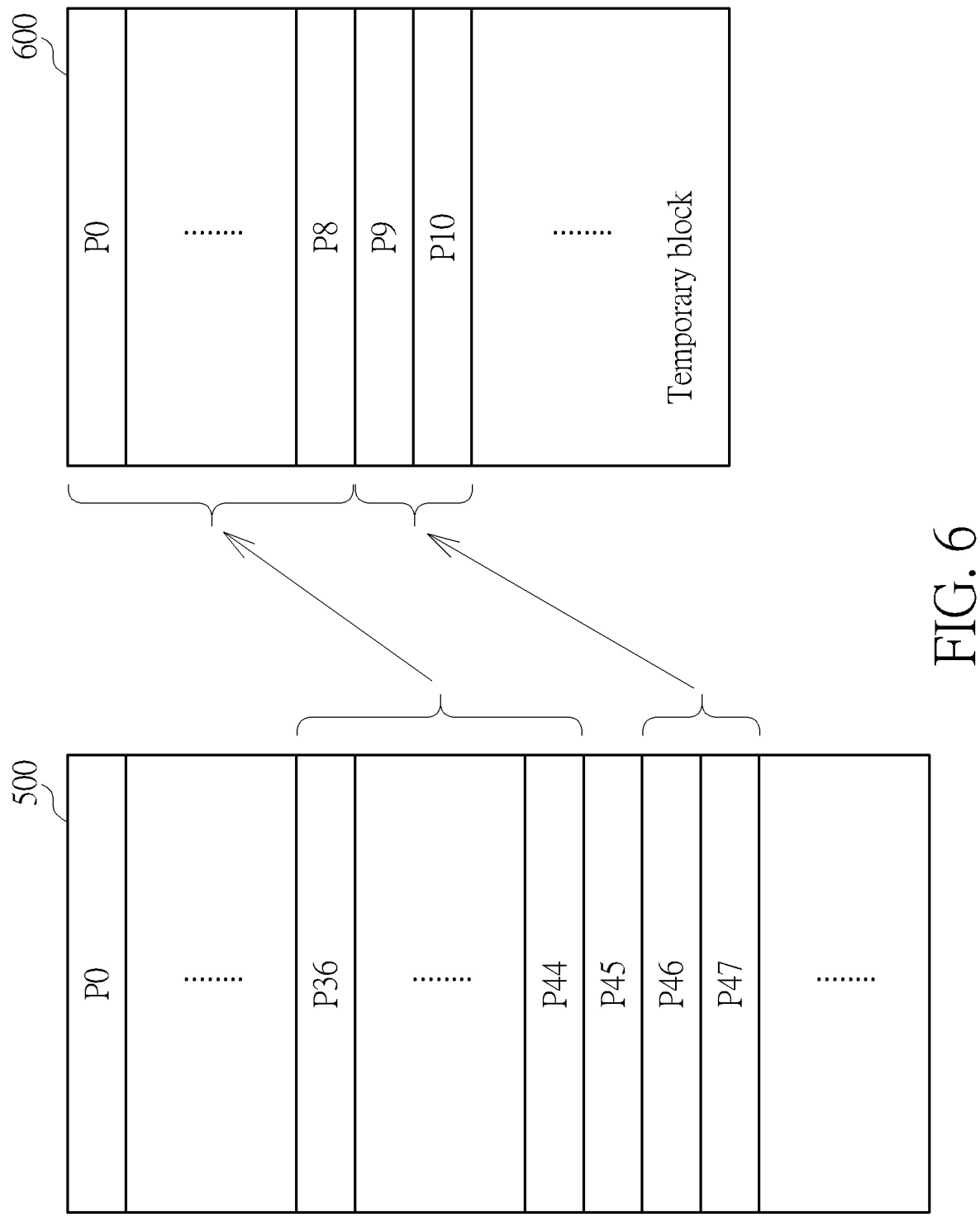
FIG. 6 is a diagram illustrating moving unsafe pages from the specific block to the temporary block.

In Step 406, the microprocessor 112 initiates a new temporary block in the flash memory module 120, such as the temporary block 600 shown in FIG. 6, and moves the unsafe pages P36-P44 and P46-P47 in the specific block 500 to the pages P0-P10 in the temporary block 600. More specifically, the microprocessor 112 may read the unsafe pages P36-P44 and P46-P47 in the specific block 500, decodes these pages with the decoder 134, and writes the decoded data into the pages P0-P10 of the temporary block 600 (assuming all pages P0-P10 can be successfully decoded). One thing should be noted in this embodiment is that all of the pages P36-P47 in the specific block 500 are assumed as having stored data. In this situation, if Page P45 is the last written page before the memory device 100 is powered on, the pages P46-P47 may be determined as blank pages and thus is not necessary to be moved into the temporary block 600.

In the operations of the flash memory module 120, if a written block contains pages of the floating gate transistors with mostly erase levels (i.e. the voltage level L1 shwon in FIG. 3), it could cause the adjacent pages to be unstable. In this embodiment, since Page P45 is a page that cannot be successfully decoded, the data stored therein and the voltage level of each floating gate transistor belongs to an uncertain state. Hence, to prevent most floating gate transistors in Page P45 from having erasing levels, In Step 408, the microprocessor 112 may be intentionally controlled to rewrite random data or other data into Page P45, to ensure most floating gate transistors in Page P45 have writing levels (the voltage levels L2-L8 shown in FIG. 3) rather than erasing levels.

Under an abnormal power off state, pages belonging to the same word line group of Page P45 are all unsafe pages. Hence, if there is one or more blank pages, sorted after Page P45, belonging to the same word line group or the next word line group, the microprocessor 112 in Step 410 may write dummy data to all these blank pages to make the data quality of the entire specific block 500 more stable. For example, assuming Page P45 is the last written page, the microprocessor 112 may write dummy data to pages P46-P47, or even write dummy data to pages P48-P59 in the next word line group.

In Step 412, considering that the specific block 500 may be in an unstable state due to the abnormal power off, the microprocessor 112 may turn off the specific block 500 and raise the priority of the quality detection or garbage collection of the specific block. More specifically, the microprocessor 112 may rearrange the data in a physical address to logical address mapping table corresponding to the specific block 500 in the buffer memory 116, and then store the data into the flash memory module. The microprocessor 112 may also remove the physical address to logical address mapping table from the buffer memory 116 to disable the specific block 500, in order to prevent the microprocessor 112 from continuously writing the data acquired from the host device 130 to the specific block 500. In addition, the microprocessor 112 may elevate the priority of the garbage collection of the specific block 500 via modifying a table or a sequence in the buffer memory 116. For example, the microprocessor 112 may establish a garbage collection priority sequence in the buffer memory 116, and directly store the settings of the specific block 500; In another example, a table may be stored in the buffer memory 116, wherein the reading times recording table records the times each block is read, and the microprocessor 112 may directly modify the reading times recording table to make the specific block 500 have an extreme large number of reading times (e.g., 10,000 times). Since the flash memory controller 110 (if available) may read the reading times recording table in order to perform quality detection upon blocks with a large number of reading times in a higher priority, and the large reading times of a block suggests that reading of the block is interfered and thus the data thereof is unstable, the timing of determining whether the specific block 500 should be performed with quality detection or garbage collection may be brought forward.

In an embodiment, when the flash memory controller 110 is available afterwards, the microprocessor may preferentially determine whether the specific block 500 needs to be performed with garbage collection according to the reading times recording table. In this moment, if the microprocessor 112 determines that the number of valid pages in the specific block 500 is very low, the microprocessor 112 may directly set the garbage collection of the specific block 500 to a higher priority. On the other hand, if the microprocessor 112 determines that the number of the valid pages in the specific block 500 is relatively large, the microprocessor 112 may sequentially read each valid page in the specific block 500, and determine quality factors such as the number of error bits thereof, the number of unsuccessful decoded pages, the threshold voltage shifting amount and so on, in order to determine whether to perform garbage collection upon the specific block 500 in a higher priority. For example, when the data quality of the block 500 is not ideal (i.e. below expectation), the microprocessor 112 may set the garbage collection of the specific block 500 in a higher priority; and when the data quality of the block 500 confirms to a specific standard, the microprocessor 112 may again modifies the reading times recording table to make the specific block 500 have lower reading times (e.g., 0 times).

Here is a brief summary of the present invention. According to the flash memory controller and associated management method of the present invention, after the flash memory controller is powered on, only a portion of data in the last written block is moved to another temporary block in order to accelerate the booting time of the electronic device. In addition, the flash memory controller may also elevate the priority of performing garbage collection upon the last written block before the flash memory controller is powered on, in order to perform quality detection or garbage collection upon the last written block before powering on when the flash memory controller is not busy. The various features of the present invention may protect the contents of blocks that are being written, without lengthening the booting time of the electronic device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A flash memory controller, wherein the flash memory controller is arranged to access a flash memory module, the flash memory module comprises a plurality of blocks, and the flash memory controller comprises:
   a read-only memory (ROM), configured to store a program code;
   a microprocessor, configured to execute the program code to control the access of the flash memory module; and
   a decoder;
   wherein when the flash memory controller is powered on, the microprocessor reads data of a plurality of pages from a specific block in the flash memory module, and the decoder decodes data of said plurality of pages; and when any page within said plurality of pages cannot be decoded successfully, the microprocessor seals the specific block in order to raise a priority of quality detection or garbage collection of the specific block.

2. The flash memory controller of claim 1, wherein the specific block is the last written block before the flash memory module is powered on, and said plurality of pages at least comprise a plurality of pages in the specific block.

3. The flash memory controller of claim 1, wherein when any page within said plurality of pages cannot be successfully decoded, the microprocessor initiates a temporary block in the flash memory module, and moves data of at least one portion of pages in said plurality of pages of the specific block that can be successfully decoded to the temporary block.

4. The flash memory controller of claim 3, wherein the flash memory module is a stereoscopic flash memory module, and the microprocessor only moves data of pages that can be successfully decoded, which belongs to a same word line set or an adjacent word line set of the pages that cannot be successfully decoded, to the temporary block.

5. The flash memory controller of claim 1, wherein the memory controller further comprises a buffer memory, the microprocessor modifies a table or a sequence in the buffer memory, in order to raise the priority of quality detection or garbage collection of the specific block.

6. The flash memory controller of claim 5, wherein the table records a number of reading times of the specific block, and the microprocessor modifies the number of reading times for raising the priority of quality detection or garbage collection of the specific block.

7. The flash memory controller of claim 1, wherein when any page within said plurality of pages cannot be successfully decoded, the microprocessor reprograms pages that cannot be successfully decoded.

8. The flash memory controller of claim 7, wherein when any page within said plurality of pages cannot be successfully decoded, the microprocessor performs random data writing upon the pages that cannot be successfully decoded.

9. The flash memory controller of claim 1, wherein when any page within said plurality of pages cannot be successfully decoded, the microprocessor writes invalid data to blank pages belonging to a same word line set or an adjacent word line set of pages that cannot be successfully decoded.

10. A method of managing a flash memory module, wherein the flash memory module comprises a plurality of blocks, and the method comprises:

when the flash memory module is powered on, reading data of a plurality of pages from a specific block in the flash memory module;

decoding data in said plurality of pages; and when any page within said plurality of pages cannot be successfully decoded, sealing the specific block and raising a priority of quality detection or garbage collection of the specific block.

11. The method of claim 10, wherein the specific block is the last written block before the flash memory module is powered on, and said plurality of pages at least comprises a plurality of pages in the specific block.

12. The method of claim 10, further comprising:

when any page within said plurality of pages cannot be successfully decoded, initiating a temporary block in the flash memory module; and moving pages within said plurality of pages of the specific block that can be successfully decoded to the temporary block.

13. The method of claim 12, wherein the flash memory module is a stereoscopic flash memory module, and the method further comprises:

only moving data of pages that cannot be successfully decoded, which belongs to a same word line set or adjacent word line set of pages that cannot be successfully decoded, to the temporary block.

14. The method of claim 10, wherein the step of raising priority of quality detection or garbage collection of the specific block comprises:

modifying a table or a sequence in a buffer memory for raising the priority of quality detection or garbage collection of the specific block.

15. The method of claim 14, wherein the table records a number of reading times of the specific block, and the step of raising the priority of quality detection or garbage collection of the specific block comprises:

modifying the number of reading times for raising the priority of quality detection or garbage collection of the specific block.

16. The method of claim 10, further comprising:

when any page within said plurality of pages cannot be successfully decoded, reprogramming pages that cannot be successfully decoded.

17. The method of claim 16, wherein the step of reprogramming the pages that cannot be successfully decoded comprises:

performing random data writing upon the pages that cannot be successfully decoded.

18. The method of claim 10, further comprising:

when any page within said plurality of pages cannot be successfully decoded, writing invalid data to blank pages belonging to a same word line set or and adjacent word line set of pages cannot be successfully decoded.

19. An electronic device, comprising:

a flash memory module, comprising a plurality of blocks; and a flash memory controller, configured to access the flash memory module;

wherein when the flash memory controller and the flash memory module are powered on, the flash memory controller reads data of a plurality of pages from a specific block in the flash memory module, and decodes data in said plurality of pages; and when any page within said plurality of pages cannot be successfully decoded, the flash memory controller seals the specific block and raises a priority of quality detection or garbage collection of the specific block.

* * * * *